US010483719B2

(12) United States Patent
Deppe

(10) Patent No.: US 10,483,719 B2
(45) Date of Patent: Nov. 19, 2019

(54) SEMICONDUCTOR DEVICES WITH DEPLETED HETEROJUNCTION CURRENT BLOCKING REGIONS

(71) Applicant: University of Central Florida Research Foundation, Inc., Orlando, FL (US)

(72) Inventor: Dennis G. Deppe, Oviedo, FL (US)

(73) Assignee: University of Central Florida Research Foundation, Inc., Orlando, FL (US)

( * ) Notice: Subject to any disclaimer, the term of this patent is extended or adjusted under 35 U.S.C. 154(b) by 0 days.

(21) Appl. No.: 15/648,235

(22) Filed: Jul. 12, 2017

(65) Prior Publication Data

US 2018/0019302 A1    Jan. 18, 2018

Related U.S. Application Data

(60) Provisional application No. 62/361,531, filed on Jul. 13, 2016.

(51) Int. Cl.
  *H01S 5/183*    (2006.01)
  *H01L 21/04*    (2006.01)
  (Continued)

(52) U.S. Cl.
  CPC ........ *H01S 5/18308* (2013.01); *H01L 21/046* (2013.01); *H01L 29/0619* (2013.01);
  (Continued)

(58) Field of Classification Search
  None
  See application file for complete search history.

(56) References Cited

U.S. PATENT DOCUMENTS

| 5,226,053 A | 7/1993 | Cho et al. |
| 5,594,751 A | 1/1997 | Scott |
| (Continued) | | |

FOREIGN PATENT DOCUMENTS

| EP | 0317007 A1 | 5/1989 |
| WO | 9750109 | 12/1997 |

OTHER PUBLICATIONS

L.A. Coldren, et al., "Diode Lasers and Photonic Integrated Circuits", John Wiley & Sons, Inc., 1995, Wiley Series in Microwave and Optical Engineering, p. 22.
(Continued)

*Primary Examiner* — Anthony Ho
*Assistant Examiner* — Kevin Quinto
(74) *Attorney, Agent, or Firm* — Jetter & Associates, P.A.; Neil R. Jetter

(57) ABSTRACT

A semiconductor device includes an upper and lower mirror. At least one active region for light generation is between the upper and lower mirror. At least one cavity spacer layer is between at least one of the upper and lower mirror and the active region. The device includes an inner mode confinement region and an outer current blocking region. A depleted heterojunction current blocking region (DHCBR) including a depleting impurity is within the outer current blocking region of ≥1 of the upper mirror, lower mirror, and the first active region. A middle layer including a conducting channel is within the inner mode confinement region that is framed by the DHCBR. The DHCBR forces current flow into the conducting channel during normal operation of the light source.

19 Claims, 10 Drawing Sheets

(51) Int. Cl.

| | |
|---|---|
| *H01L 29/06* | (2006.01) |
| *H01L 29/16* | (2006.01) |
| *H01L 29/165* | (2006.01) |
| *H01L 29/739* | (2006.01) |
| *H01L 29/78* | (2006.01) |
| *H01L 29/808* | (2006.01) |
| *H01L 33/14* | (2010.01) |
| *H01S 5/20* | (2006.01) |

(52) U.S. Cl.
CPC ........ *H01L 29/165* (2013.01); *H01L 29/1608* (2013.01); *H01L 29/7395* (2013.01); *H01L 29/7828* (2013.01); *H01L 29/8083* (2013.01); *H01L 33/145* (2013.01); *H01S 5/2063* (2013.01); *H01S 5/18358* (2013.01)

(56) References Cited

U.S. PATENT DOCUMENTS

| | | | |
|---|---|---|---|
| 5,754,578 A | 5/1998 | Jayaraman | |
| 5,881,089 A | 3/1999 | Berggren et al. | |
| 6,111,273 A * | 8/2000 | Kawai | H01L 21/2654 |
| | | | 257/102 |
| 6,563,141 B1 | 5/2003 | Dawson et al. | |
| 6,795,478 B2 | 9/2004 | Hwang et al. | |
| 8,774,246 B1 * | 7/2014 | Deppe | H01S 5/18386 |
| | | | 372/45.01 |
| 2001/0043636 A1 | 11/2001 | Bewley et al. | |
| 2002/0110196 A1 | 8/2002 | Nguyen et al. | |
| 2002/0176465 A1 | 11/2002 | Kondow et al. | |
| 2002/0191656 A1 | 12/2002 | Mawst et al. | |
| 2003/0164504 A1 | 9/2003 | Kaneko | |
| 2005/0063440 A1 | 3/2005 | Deppe | |
| 2005/0249254 A1 | 11/2005 | Deppe | |
| 2008/0135831 A1 | 6/2008 | Taylor et al. | |
| 2010/0265976 A1 | 10/2010 | Bousquet et al. | |
| 2010/0272145 A1 | 10/2010 | Weichmann et al. | |
| 2011/0150019 A1 | 6/2011 | Leatherdale et al. | |
| 2011/0280269 A1 | 11/2011 | Chang-Hasnain et al. | |
| 2013/0062657 A1 * | 3/2013 | Fang | H01L 33/145 |
| | | | 257/99 |
| 2015/0086220 A1 | 3/2015 | Warren | |
| 2015/0318666 A1 | 11/2015 | Hammar et al. | |
| 2016/0072258 A1 | 3/2016 | Seurin et al. | |

OTHER PUBLICATIONS

Carl W. Wilmsen, et al., "Vertical-Cavity Surface-Emitting Lasers", Cambridge University Press, 1999, Fundamental Issues in VCSEL Design, pp. 44-49.

* cited by examiner

SEMICONDUCTOR DEVICES WITH DEPLETED HETEROJUNCTION CURRENT BLOCKING REGIONS

CROSS REFERENCE TO RELATED APPLICATIONS

This application claims the benefit of Provisional Application No. 62/361,531 entitled "VERTICAL CAVITY DEVICES" filed on Jul. 13, 2016, which is herein incorporated by reference in its entirety.

STATEMENT REGARDING FEDERALLY SPONSORED RESEARCH

This invention was made with Government support under Phase III SBIR Contract No. W911NF-14-C-0088 awarded by the Department of Defense (DOD) funding agency, the Army Research Laboratory. The U.S. Government has certain rights in this invention.

FIELD

Disclosed embodiments relate to semiconductor heterostructure devices that include conducting-channel structures that can produce optical and/or electrical confinement such as semiconductor vertical cavity diode light sources.

BACKGROUND

A Vertical Cavity Surface Emitting Laser (VCSEL) is a laser resonator that includes two mirrors that are typically distributed Bragg reflector (DBR) mirrors which have layers with interfaces oriented substantially parallel to the die or wafer surface with an active region. The active region may include one or more bulk layers, quantum wells, quantum wires, or quantum dots for the laser light generation in between. The planar DBR-mirrors comprise layers with alternating high and low refractive indices. Each layer has a thickness of approximately one quarter of the laser wavelength in the material, or an odd integer multiple of the quarter wavelength, or in some cases even integer multiple of the quarter thickness, depending on layer placement and optical interference effects. The mirror layers can produce intensity reflectivities that may be above 99%, and in other cases may be produce much lower values of reflectivity. Slightly lower values than 99% can be useful to obtain high extraction efficiency of the laser light from VCSELs, and much lower values can be useful for RCLEDs or LEDs. Mirrors can also be made of other materials, including dielectrics or metals.

High-speed optical data networks, optical sensors, illuminating systems, and other optical systems can use VCSELs. Oxide-confined VCSELs were first demonstrated in 1993 and are commonly used in transmitters and transceivers for high-speed optical data networks. Oxide-confined VCSELs can be made to operate at speeds of 25 Gbps to 28 Gbps while retaining temperature performance needed for commercial applications.

RCLED's are described in U.S. Pat. No. 5,226,053. A RCLED is a light emitting diode (LED) that generates mainly spontaneous emission and generally operates without a distinct threshold. The drive voltage of a spontaneous emitter can be less than its photon energy divided by the electron charge, under which condition it ideally absorbs heat in its light emission process. The RCLED's drive voltage can also exceed its photon energy, under which it generally generates heat in its light emission.

Oxide VCSELs and oxide RCLEDs use an oxide aperture to obtain low threshold and high efficiency by providing high electrical current confinement and optical mode confinement to the transverse optical cavity. This aperture establishes the transverse modes of the lateral cavity. However, because of the oxide aperture, oxide VCSELs also suffer manufacturing and reliability problems caused by the oxide. Achieving electrical and mode confinement similar to oxide VCSELs without using the oxide aperture however has presented a hurdle to developing high performance vertical-cavity devices.

Selective oxidation has been used in attempts to fabricate other types of heterostructure devices, such as edge-emitting laser diodes, transistors or waveguides. However these devices suffer to a greater degree from material problems especially with the heterointerfaces that are also caused by the presence of the oxide layer. Therefore, despite the attractive properties of the selective oxidation, it has mainly been relegated in commercial devices to its wide-spread use in vertical cavity devices.

There are also other ways by which to make vertical cavity devices to create internal electrical confinement and optical confinement. For example, implantation process based on proton implantation is used to create proton-implanted VCSELs by implanting into high-energy protons to damage the crystal and cause a resistive aperture in the upper p-type mirror of a VCSEL. Other ion implanted impurity species have also been used to cause resistive regions through the crystal damage caused by the implant. These types of resistive regions caused by implant damage will generally regain unwanted conductivity if process steps that follow the implant are performed at too high of temperature. This also limits flexibility in VCSEL design. Another problem is that the implant regions cause excessive damage to the crystal that generally use thick implanted layers with heavy dose implants that result in large vertical and lateral straggle. Therefore the implanted regions should be kept away from the cavity spacer that causes high electrical resistance and low efficiency. Therefore both the thickness of the implanted region and its inability to retain high resistivity under high temperature process steps has led to generally unfavorable performance from proton implanted vertical-cavity devices.

Other semiconductor devices such as other types of semiconductor lasers, light emitting diodes, photodetectors and electronic devices all generally make use of current blocking regions. These devices can also benefit from improved forming of these current blocking regions.

SUMMARY

This Summary is provided to introduce a brief selection of disclosed concepts in a simplified form that are further described below in the Detailed Description including the drawings provided. This Summary is not intended to limit the claimed subject matter's scope.

It is recognized herein that there remains a need for vertical-cavity semiconductor devices for which electrical and optical confinement can be achieved with an aperture that can be thin, made epitaxially for high reliability and good heat flow, and provide high electrical confinement outside the aperture as well as low resistance electrical transport within the aperture. Furthermore benefits in device operation, manufacturing and reliability can be made to vertical-cavity semiconductor heterostructure devices including light sources utilizing improved apertures that can be thin, and be placed close to the light source active region with minimal leakage current for high efficiency, provide high heat flow and limit damage to the semiconductor material of the light source to produce high reliability.

A feature of disclosed conducting-channel structures for semiconductor heterojunction devices such as semiconductor vertical cavity diode light sources is the use of a depleted heterojunction current blocking region (DHCBR) for current blocking, where the DHCBR includes a depleting impurity region including at least one depleting impurity specie. A depleting impurity specie is defined herein as an impurity that is introduced sufficiently close and in a sufficient concentration to a heterojunction of the DHCBR such that DHCBR's electrical resistance and current blocking is increased over that for which the depleting impurity is absent. A depleting impurity specie, which may be a dopant atom in the semiconductor crystal, increases the depletion of the heterojunction to increase current blocking. This is in contrast to impurity species typically used in DBR mirrors to increase the electrical conductivity, for example a species that decreases the depletion of the heterojunction to lower the electrical resistance, as is typically found in the doped epitaxial mirrors of vertical-cavity light sources. The DHCBR is positioned to force current flow into the conducting channel during normal operation of the vertical light source. As used herein, "normal operation of the vertical light source" refers to electrical biasing of an electrically pumped light source needed to obtain light emission. For example, in the case of VCSEL the forward voltage used for biasing during normal device operation for generating light emission is typically about 1.8V.

Through use of a disclosed DHCBR including a depleting impurity region the concentration and distribution of the depleting impurity specie can be minimized to also reduce crystal damage. High crystal material quality can even be retained when the depleting impurity specie(s) is implanted, as well as when the DHCBR is placed close to or within the cavity spacer of a vertical cavity light source or other device such as an edge-emitting laser, transistor, detector or diode. This is because the DHCBR combines the current blocking capability of a depleted heterojunction with moderate concentration, implantation energy, dose, diffusion depth or other process parameters needed to introduce the depleting impurity specie so that process induced damage to the semiconductor crystal that results from fabrication can be minimized.

Layers are disclosed below that may represent epitaxial material compositional layers of a given material, or collections of epitaxial material compositional layers grouped to perform one or more functions. For example, a DBR mirror layer is an epitaxial layer that will generally include various material compositional layers for their electronic properties while the collection of epitaxial material compositional layers serve as a single DBR mirror layer. This will generally be true, for example, for a quarter-wave optically thick mirror layer. The same may be and generally will be true for a cavity spacer layer, a current blocking layer, an active region layer, and what is referred to as a middle layer. A low index DBR layer refers to a DBR layer for which the weighted average within an optical field has on average a low refractive index relative to an adjoining DBR layer that may on weighted average have a relatively high refractive index. These layers can be described respectively as relatively low index layers or relatively high index layers, or low index and high index layers respectively. These layers in general will include epitaxial layers of compositionally graded materials, such as varying Al content for the case of AlGaAs or AlGaN. This is also true, for example, of cavity spacer layers and other layers that may be high index or low index layers.

DHCBR layers or epitaxial layers used to form DHCBR layers will have a net effect of creating at least one heterojunction band offset that serves to impede current flow because of the band offset. The heterojunction may be a graded heterojunction. In certain material systems such as for example AlGaAs, AlGaN, or InGaAlAs materials, higher Al content materials can generally be adjoined to lower Al content materials to form the necessary band offsets to create a depleted heterojunction if a DHCBR. The depleted heterojunction can be made to block or impede mobile hole flow due to the valence band offset from the low Al content layer to the high Al content layer. In this case, if these were mirror layers, this would also correspond to impeding hole flow from the high index optical layer to the low index optical layer. With sufficient valence band offset and choice of doping and depleting impurity profile, the high Al content layer can form a DHCBR relative to the lower Al content layer. This can also be the case for cavity spacer layers.

As used herein a "cavity spacer layer" is defined to be a cavity region that includes the active region where field undergoes phase change to create the resonance condition of the vertical cavity. Typically the cavity spacer thickness will be approximately an integer number of half-wavelengths thick. The cavity spacer generally may have an upper cavity spacer region or lower cavity spacer region. For example, in a full wave cavity spacer the first mirror layer may be an AlGaAs layer that has an Al composition that is increased over the material of the cavity spacer. If the active region is placed near the center of the full-wave cavity spacer it will have an upper cavity spacer region and a lower cavity spacer region. In a half-wave cavity, in contrast, the first mirror layer may be an AlGaAs composition that is lower in Al content as compared to the Al content of the AlGaAs cavity spacer. It is also possible that an active region is placed at the edge of a cavity spacer, if properly designed to be close to a field intensity peak formed by the cavity spacer.

The DHCBR can also be used to block electron flow for which the higher Al content layer can block electron flow from the lower Al content layer, given a large enough difference and choice in Al contents. The DHCBR design to block electron flow should also consider the well-known direct-indirect conduction band crossover in properly accounting for conduction band offsets in its design.

DETAILED DESCRIPTION

Figure 1A:
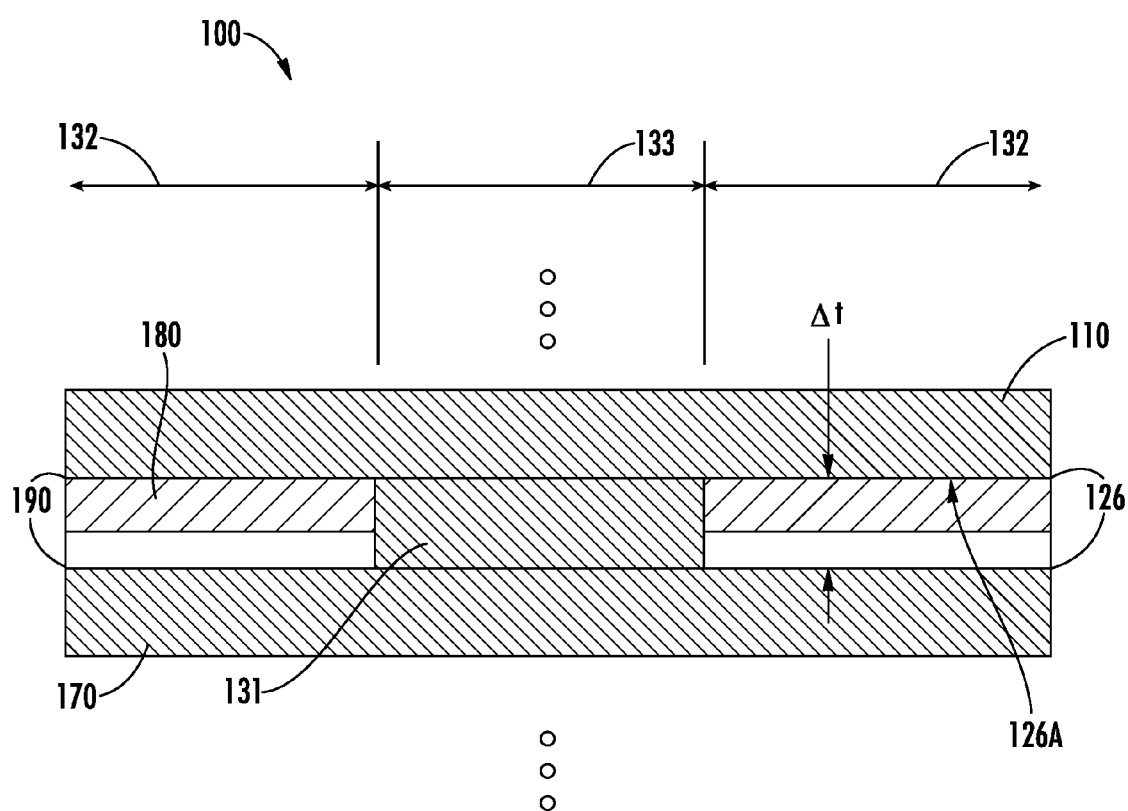
FIG. 1A is a schematic cross sectional diagram of a DHCBR including a depleting impurity region and conducting channel formed in a middle layer.

Disclosed embodiments in this Disclosure are described with reference to the attached figures, wherein like reference numerals are used throughout the figures to designate similar or equivalent elements. The figures are not drawn to scale and they are provided merely to illustrate the disclosed embodiments. Several aspects are described below with reference to example applications for illustration. It should be understood that numerous specific details, relationships, and methods are set forth to provide a full understanding of the disclosed embodiments.

One having ordinary skill in the relevant art, however, will readily recognize that the subject matter disclosed herein can be practiced without one or more of the specific details or with other methods. In other instances, well-known structures or operations are not shown in detail to avoid obscuring structures or operations that are not well-known. This Disclosure is not limited by the illustrated ordering of acts or events, as some acts may occur in different orders and/or concurrently with other acts or events. Furthermore, not all illustrated acts or events are required to implement a methodology in accordance with this Disclosure.

Notwithstanding that the numerical ranges and parameters setting forth the broad scope of this Disclosure are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5.

FIG. 1A shows a schematic cross sectional diagram of an example partial semiconductor heterostructure 100 of a semiconductor device that includes a common epitaxial middle layer (middle layer) 190 comprising a DHCBR 126 in the outer current blocking region 132 and a conducting channel 131 in the inner mode confinement region 133. The DHCBR 126 is shown being the same layer as the middle layer 190. As described above, the DHCBR 126 is positioned to force current flow into the conducting channel 131 during normal operation of the semiconductor device.

The middle layer 190 is adjoined by a top layer 110 and a bottom layer 170 for which at least layer the top layer 110 forms a heterojunction with the middle layer 190. The heterojunction between the top layer 110 and the middle layer 190 creates a band offset that can deplete the mobile charge from the middle layer 190 in the outer current blocking region 132. In addition, the middle layer 190 includes a depleting impurity region 180 including at least one depleting impurity specie that increases this depletion, working together with the heterojunction band offset between top layer 110 and middle layer 190.

The concentration and choice of doping level of the depleting impurity depends on the grown-in dopant level that exists in middle layer 190, how close the depleting impurity 180 is placed relative to the heterojunction 126A, the depleting impurity species, and the method by which the depleting is introduced into the crystal. For example, the conducting channel 131 may be due to a grown-in impurity so that this grown-in impurity also exists in middle layer 190. If a depleting impurity such as oxygen is implanted that forms a deep level, its peak concentration can be placed close to and even including the heterojunction 126A. If the grown-in impurity in layer 190 is for example carbon so that conducting channel 131 is p-type, the grown-in carbon doping may be in the range of $\sim 10^{17}$ cm$^{-3}$ to $\sim 5 \times 10^{19}$ cm$^{-3}$ or even $\sim 10^{20}$ cm$^{-3}$. Implanted oxygen may include deep levels that can take on multiple charge states. The peak concentration of the implanted oxygen then generally need only to be approximately equal to the grown-in carbon doping, or also be in the range of $\sim 10^{17}$ cm$^{-3}$ to $\sim 10^{20}$ cm$^{-3}$. A similar case can occur for implanted silicon as the depleting impurity, which generally involves a relatively high temperature anneal of 750° C. or above to achieve a high activation ratio. The 750° C. temperature is beyond what is typical of epitaxial crystal growth, so that while the silicon can remain stable in the semiconductor crystal lattice it also forms deep levels.

Because the DHCBR 126 having a depleting impurity can be formed with a shallow implant, the dose and energy of the implant can be reduced. If the vertical implant straggle for example is $\sim 500$ Å, the implant dose needed to reach a peak concentration of $10^{19}$ cm$^{-3}$ of the depleting impurity is less than or about $10^{14}$ cm$^{-2}$.

However the implant dose and energy alone are not sufficient, the heterojunction 126A should generally also have sufficient band offset to create the depleted heterojunction. If the DHCBR 126 is formed from AlGaAs materials with varying Al composition, the Al difference between middle layer 190 and top layer 110 (including grading at the heterointerface) should generally be sufficient to also deplete the interface between the middle layer 190 and top layer 110 and block hole transport in the outer current blocking region 132. This total offset should generally exceed at least a few $k_BT$ where $k_BT$ is the thermal energy, and ideally be 5~10 times $k_BT$ or greater. In this way the top layer 110 can remain largely undepleted in the outer current blocking region, while the middle layer 190 can be depleted. Otherwise although the shallow implant can cause depletion, the leakage current can be high and the top layer 110 may also be depleted. Although the DHCBR 126 is still formed if the top layer 110 is also depleted, maintaining conductivity in the top layer 110 can lower the electrical resistance of the semiconductor device.

If conducting channel 131 itself in inner mode confinement region 133 is formed by selectively introducing an acceptor impurity, such as implanting or diffusing a Column II impurity with high activation, the doping of the middle layer 190 can be quite low. In this case the depleting impurity concentration can also be much lower. This is also true if the depleting impurity is an impurity grown-in epitaxially, such as silicon, and is insufficient to convert middle layer 190 to n-type but still at sufficient concentration to aid in depletion. A low concentration background concentration of silicon such as ~$10^{17}$ cm$^{-3}$ in the middle layer 190 may deplete the heterojunction 126A in the outer current blocking region 132, and yet be counter doped by selectively introducing acceptor impurity into the conducting channel 131 in the inner mode confinement region at a concentration exceeding, for example $10^{17}$ cm$^{-3}$.

The semiconductor materials for the semiconductor heterostructure 100 can comprise compound semiconductor materials such as AlGaN, AlGaAs, or InAlGaAs, as examples, with varying Al composition. The semiconductor device may be a vertical-cavity light source, an edge-emitting light source, a transistor, a diode, or similar device for which heterostructures may be created that have the desired band offsets. There may also be a substrate under the middle layer 190. For growths on InP the DHCBR 126 may include InP/InGaAsP and/or InAlGaAs materials.

The conducting channel 131 is formed in the inner confinement region 133 by choice of impurities and can also include a modified heterojunction between the top layer 110 and the middle layer 190 relative to the outer current blocking region 132. Conducting channel 131 may be formed by introducing sufficient acceptor doping into the conducting channel 131 to overcome the depletion effect caused by the depleting impurity region 180 and create a sufficient equilibrium hole charge in the conducting channel 131 to provide low electrical resistance through the channel.

Assuming initially that top layer 110, bottom layer 170, and the conducting channel 131 are each electrically conductive due to mobile hole charge, this mobile hole charge will in general experience increased impedance in making a transition across the heterojunction from top layer 110 to the middle layer 190 if the middle layer 190 has a negative valence band energy offset relative to top layer 110. The negative valence band offset creates a potential barrier to the hole charge and in general causes depletion in the middle layer 190 at the heterojunction between the top layer 110 and the middle layer 190. This typically occurs in III-V semiconductors such as AlGaAs when the Al content in the top layer 110 is less than the Al content of the middle layer 190 to which the hole charge makes the transition. Incorporating a depleting impurity in middle layer 190 can increase this depletion. This depletion of middle layer 190 caused by its heterojunction with top layer 110 and the depleting impurity region 180 combined with the potential barrier of the heterojunction to hole flow can produce an effective current blocking region, or DHCBR 126.

By modifying either the acceptor doping or depleting impurity region in the inner mode confinement region 133, along with optionally modifying the heterojunction characteristics between middle layer 190 and the top layer 110 in the inner confinement region 133, the conducting channel 131 can be formed.

The DHCBR 126 including the depleting impurity region 180 and conducting channel 131 are generally formed in at least a two-step epitaxial growth process. This two step growth process and the DHCBR characteristics enable thin layer processing to be employed and can produce a fully epitaxial current blocking region 132 based on the DHCBR 126, and the conducting channel 131. The thin layer processing enable both high material quality and a low electrical resistance conducting channel 131 to be fabricated, since only shallow diffusions or implantation of impurities can be used. Furthermore stable impurities can be used, including shallow acceptors and donors as well as one or more stable depleting impurity species in depleting impurity region 180 to be used in the fabrication. These stable impurities can retain desired profiles to enable high quality epitaxial growth to be used in the subsequent growth step of at least the two-step epitaxial growth process. In addition, the need to achieve only shallow impurity profiles to create both the DHCBR 126 and conducting channel 131 limit the crystal defects that result from either implantation, diffusion, or grown-in impurities. The device efficiency that results can thus be high since low electrical resistance can be achieved through the conducting channel 131. While the middle layer 190 in the outer current blocking region 132 is depleted at its heterointerface with the top layer 110, top layer 110 can remain highly conducting. Considering the contact resistance for a p-conducting channel with a thickness Δt, shown in FIG. 1A, it can be given approximately by the following:

$$\rho_{Channel} = \frac{\Delta t}{q \mu_h P_{Channel}} \quad (1)$$

where now $P_{Channel}$ is the hole concentration in the conducting channel 131, q is the electronic charge, and μh is the hole mobility. The smaller the channel thickness Δt, the lower will be the contact resistance of the conducting channel 131 in the device. In practice Δt may be only a few hundred angstroms of thickness or less, depending on the specific layer designs of top layer 110, middle layer 190, and bottom layer 170. Because the top layer 110 can remain relatively highly conducting by using a disclosed DHCBR, this also reduces the electrical spreading resistance into the conducting channel 131, creating a current "funnel" and further lowering electrical resistance of the device.

Assuming that the conducting channel 131 contains mobile hole charge due to net acceptor doping, the valence band offset between top layer 110 and middle layer 190 in the outer current blocking region 132, when combined with the depleting impurities in the depleting impurity region 180, should be sufficiently large in potential energy such that it forms an effective current block in the DHCBR region. Assuming a flat band condition in to layer 110 and middle layer 190 on either side of the heterojunction at their interface, the carrier density in the middle layer 190 can be decreased by $\exp(-\Delta E_v/k_BT)$, where $\Delta E_v$ is the valence band offset between the top layer 110 and the middle layer 190, $k_B$ is the Boltzman constant and T is temperature.

This valence band offset can be several hundred milli electron volts, much greater than the thermal energy (kT) of the mobile hole charge for usable device temperatures. The device operating temperature may be desired to reach 150° C. or greater, so that thermal energy for the mobile hole charge could be ~35 meV or greater. For example, the valence band offset between $Al_{0.2}Ga_{0.8}As$ (i.e. top layer 110) and $Al_{0.7}Ga_{0.3}As$ (middle layer 190) is >200 meV. The carrier density can then be decreased in the middle layer 190 relative to top layer 110 by three orders of magnitude or more depending on the concentration of the depleting impurities in the depleting impurity region 180. The valence band offset between $Al_{0.2}Ga_{0.8}As$ used as the top layer 110 and AlAs used as the middle layer 190 is >360 meV. When combined with one or more depleting impurities and proper doping, the depleted heterojunction 126A can be sufficient to deplete the full middle layer 190 to form the DHCBR 126. It is noted that the valence band offset between the top layer 110 and the middle layer 190 is chosen to block hole flow by limiting mobile hole charge into middle layer 190 in the DHCBR 126.

DHCBR 126 will generally be formed by a relatively low index middle layer 190 placed next to a relatively high index top layer 110. This is because high Al content layers, for example, have valence band offset relative to low Al content layer that block mobile charge flow from high index (low Al content) to low index (high Al content) layers. This can also be true for other heterojunction materials, such as GaAs and $In_{0.49}Ga_{0.51}P$ that is nominally lattice matched to GaAs. In this heterojunction material an effective depleted heterojunction can be formed using GaAs as top layer 110 and $In_{0.49}Ga_{0.51}P$ as middle layer 190, with appropriate interface grading if needed. The valence band offset from GaAs to $In_{0.49}Ga_{0.51}P$ is about 400 meV. On the other hand these two materials would not be as effective to form a depleted heterojunction for electrons, since the conduction band offset is only ~60 meV, corresponding to a couple $k_BT$ of energy.

Because of the two step growth process, both the heterojunction offset between the middle layer 190 and the top layer 110 and the impurity profiles in the middle layer 190 can be modified between the conducting channel 131 and DHCBR 126 in the middle layer 190. Although not shown, middle layer 190 for example can include a mesa region in the inner confinement region 133, with the mesa forming a different heterojunction between the top layer 110 and middle layer 190. This can be done through shallow selective etching outside or inside the growth chamber in the at least two-step epitaxial growth process. Note that in all the description above it is considered that the heterojunction between the top layer 110 and the middle layer 190 can and in general will include compositionally graded material layers. Therefore top layer 110 and middle 190 can include multiple material compositions, so that functional layers such as the middle layer 190 used for the DHCBR 126 and conducting channel 131 can be made out of multiple material layers.

Figure 1B:
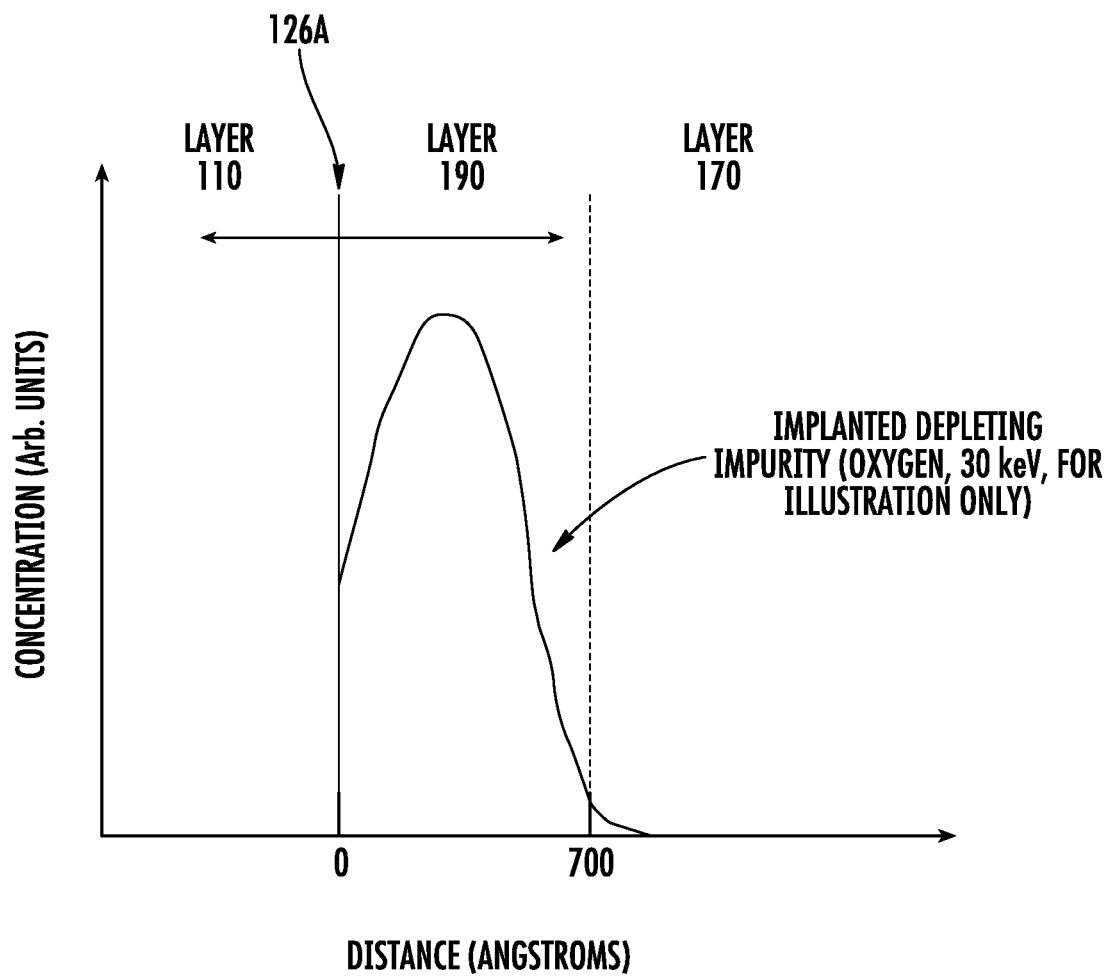
FIG. 1B shows a concentration profile of the depleting impurity for an example in which the depleting impurity is implanted oxygen.

FIG. 1B illustrates an example profile for the depleting impurity region 180, which in this case is formed from ion implanted oxygen. The oxygen implant energy for the profile shown in FIG. 1B is only 30 keV, and the dose can be $10^{14}$ cm$^{-2}$ or less. In this case it is can be an advantage if the depleted heterojunction 126A in FIG. 1A and FIG. 1B is formed directly at the epitaxially regrown interface between top layer 110 and the middle layer 190. In FIG. 1B the middle layer 190 is chosen to have a reasonable thickness of ~700 Å, but this is for illustration only. The 30 keV oxygen implant example in this particular case produces a peak in the oxygen concentration about 300 Å into the middle layer 190. The middle layer 190 may be thinner or thicker, but thin middle layers can be an advantage for reasons that have to do with optical path lengths as well as electrical resistance due to transport through the conducting channel 131 discussed above. Because of the use of the DHCBR 126, the implanted depleting impurity can be low energy to minimize defects, and the regrown epitaxial top layer 110 can be highly conducting, enabling improved hole transport to be funneled into the conducting channel 131.

Oxygen can bond in the III-V crystal and form a depleting impurity that remains relatively stable in the III-V crystal under the growth conditions needed for high quality epitaxial regrowth. However other ion-implanted impurities including shallow donors such as silicon, sulphur, and selenium, may also be used to form depleting impurities. The shallow donors in these cases are not designed to convert the III-V crystal to n-type, which could require high implant dose and high temperature anneal to activate. Instead the shallow donors are used to increase the depletion of middle layer 190. Although oxygen can also in principle form a shallow donor because of its Column VI position in the Periodic Table, it also forms a deep level in Al-bearing III-V semiconductors. Bottom layer 170 may also form a depleting heterojunction with the middle layer 190, or bottom layer 170 may have no heterojunction offset with the middle layer 190. The depletion width extending into the middle layer 190 may be set simply by the top layer 110 and the middle layer 190.

Figure 1C:
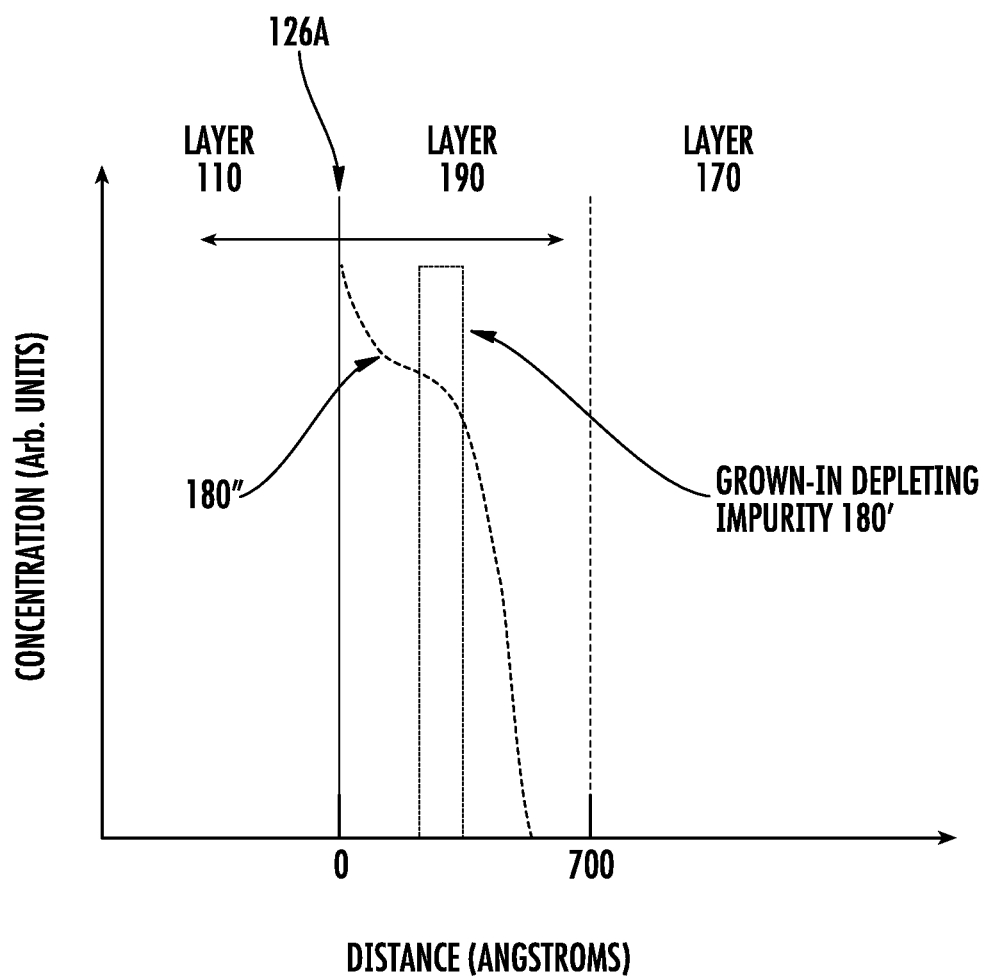
FIG. 1C shows two additional examples of depleting impurities that are either diffused into a heterojunction of the DHCBR, or epitaxially grown-in to the DHCBR with sufficient proximity and concentration to create the depleted heterojunction and the DHCBR.

FIG. 1C shows two more embodiments by which depleting impurities may be introduced into layer 190. These include an epitaxially grown-in depleting impurity 180', or a diffused depleting impurity 180". The depleting impurity in FIG. 1C can be a shallow donor, for example, given that the conducting channel 131 uses mobile hole charge due to a net acceptor concentration. In the case of the grown-in depleting impurity 180', shallow donors are an advantage by maintaining high crystal quality in conducting channel 131 for low electrical resistance. In this case the conducting channel 131 can also be formed by implantation or diffusion of one or more acceptor impurities into the middle layer 190.

Figure 1D:
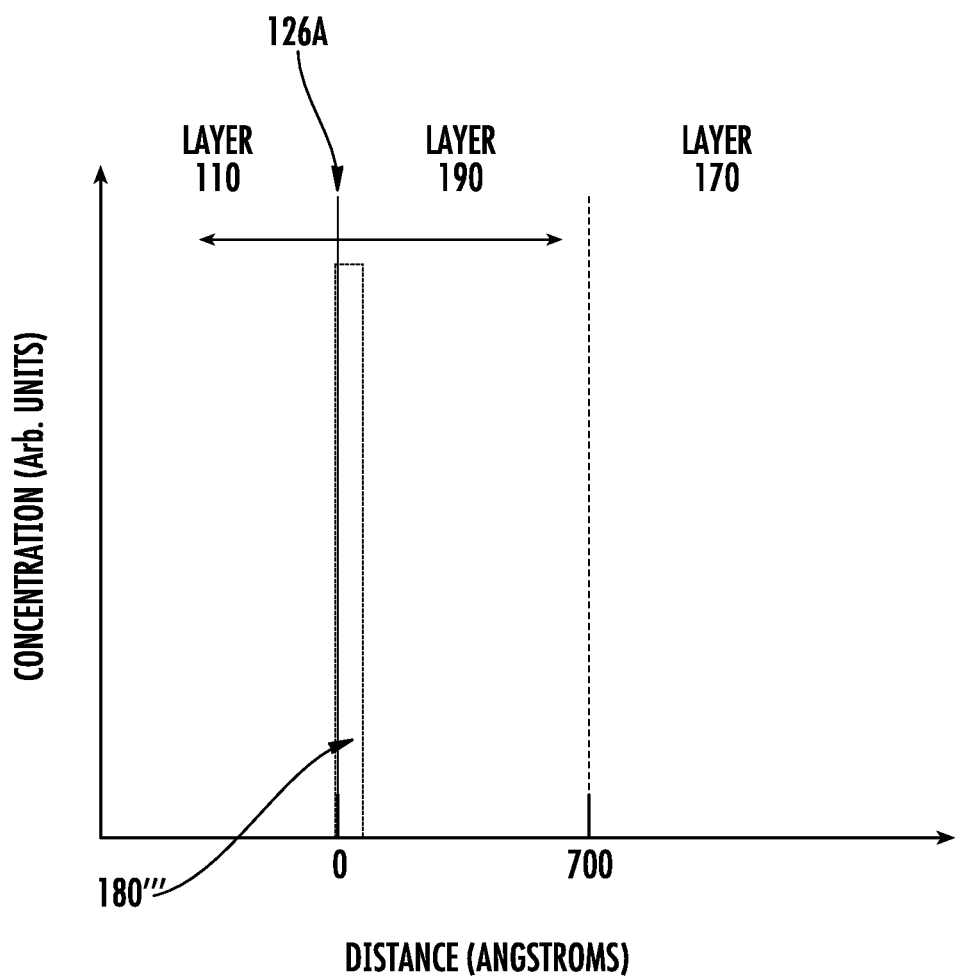
FIG. 1D shows an example of a grown-in depleting impurity directly at the interface of the depleted heterojunction.

FIG. 1D shows an alternative position for the depleting impurity 180''' that may be epitaxially grown-in at the interface of top layer 110 and middle layer 190. The depleting impurity may also exist outside the middle layer 190 if placed sufficiently close to the heterojunction 126A. In this case the depleted heterojunction 126A is still formed at the interface between top layer 110 and the middle layer 190. The grown-in depleting impurity region 180''' may be an acceptor that is complexed with a second impurity. For example Column II impurities from the Periodic Table such as Zn, Be, Cd, or Mg may be attractive because these Column II impurities can complex to form stable bonds with oxygen. These shallow impurities may also be used to increase conductivity in the conducting channel 131 where the second impurity such as oxygen is not introduced. In this case, the acceptors can be selectively complexed with another impurity such as oxygen in the DHCBR 126, and when not complexed contribute to increased conductivity in the conducting channel 131.

Figure 1E:
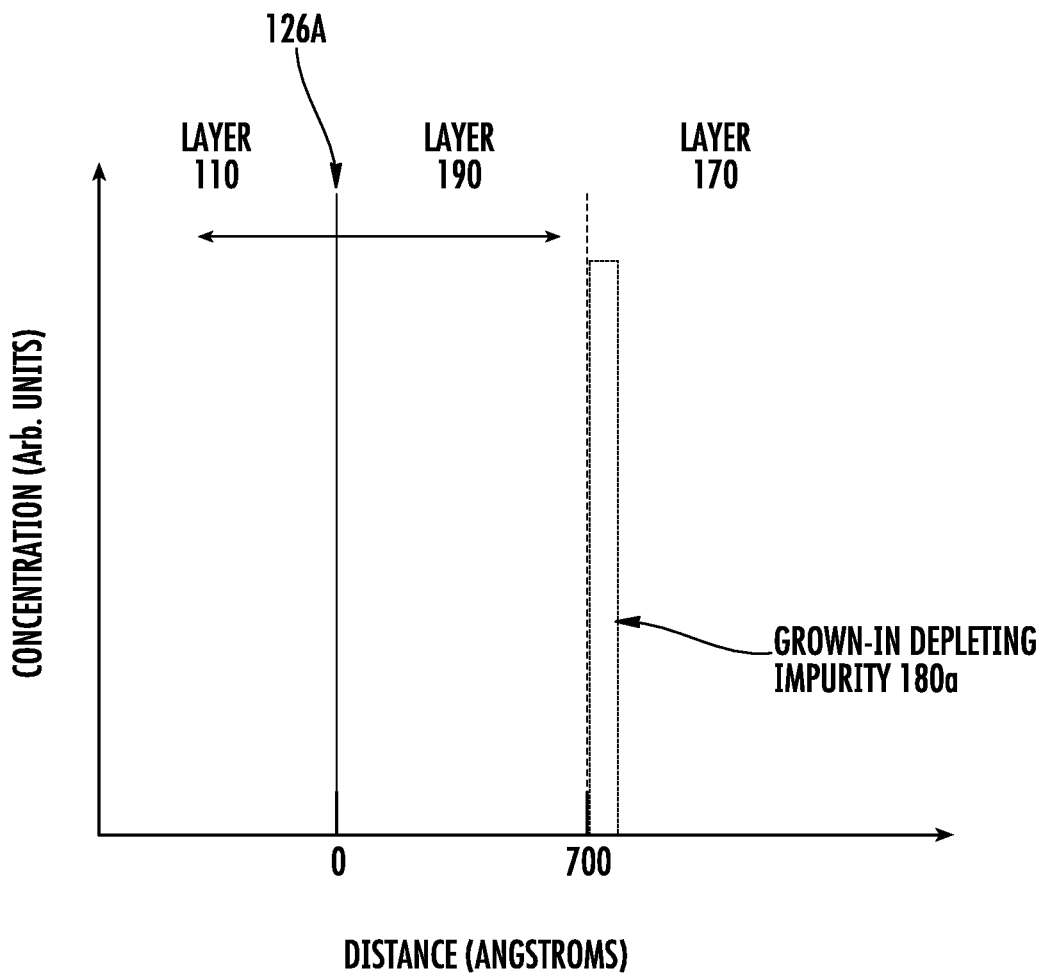
FIG. 1E shows an example of a grown-in depleting impurity for a case in which other grown-in dopants are of sufficiently low concentration in the DHCBR as to deplete the heterojunction for placement well below the depleted heterojunction.

FIG. 1E shows a depleting impurity region 180a formed outside the middle layer 190, but still used to increase the depletion of depleted heterojunction 126A. In this case the middle layer 190 is increased in depletion, which also increases the depletion of the heterojunction 126A. This is possible and shows the importance of optimal design of any acceptor doping in the middle layer 190. If middle layer 190 is for example not intentionally doped, so that it only has mobile charge due to background impurities in the epitaxial growth, its entire thickness can be readily depleted by the depleting impurity region 180a of FIG. 1E. The conducting channel 131 can still be formed by selectively introducing acceptors into only the conducting channel region 131. Assuming a p-type conducting channel 131, grown in shallow donor impurities can be used to form the depleting impurity region 180a. If the middle layer 190 is left undoped in the current blocking region 132, the conducting channel 131 can be formed by selectively introducing acceptor impurities into the middle layer 190 in the inner mode confinement region 133.

Therefore DHCBR 126 enables the depleting impurity species to be chosen from those that reside stably in the semiconductor crystal, even for high temperature processing. Shallow impurities or impurities otherwise chosen from columns of the Periodic Table that generally lead to strong crystal bonding can be used. These impurities are generally Column II, Column IV, or Column VI impurities for a III-V semiconductor material. Multiple depleting impurity species may also be used, including those that form complexes. For example and in particular, impurities from Column II impurities may complex with Column VI impurities. Zn, Mg, Be, or other Column II impurities may complex with Column VI impurities, especially oxygen. Lighter atomic weight impurities are also desirable if the depleting impurity species are implanted, since these lighter implanted impurities will generally create less crystal damage.

A mesa can also be formed on the middle layer 190 in the inner confinement region 133, which can also provide optical confinement if the device is for example, a vertical-cavity light source or edge-emitting light source. In this case the mesa and remaining region of DHCBR 126 will include a regrowth interface created by the epitaxial growth step that follows the surface processing of etching, implantation, and/or diffusion used to create either or both impurity profiles for the depleting impurity region 180 and/or the conducting channel 131. Therefore the middle layer 190 may not necessarily be fully planar, and instead can have thicker or thinner regions depending on the fabrication of both the DHCBR 126 and conducting channel 131. In all of the above described embodiments it is possible to use a conducting channel and conductivity in the top layer 110 and the bottom layer 170 that is n-type.

The scheme of using the middle layer 190 as a common epitaxial layer that includes the DHCBR 126 including a depleting impurity region 180 and conducting channel 131 is especially attractive for vertical cavity light sources. The middle layer 190 can comprise a low index DBR mirror layer, while adjoining layers may include a high index DBR mirror layer and a cavity spacer layer. In addition, a cavity spacer layer can be used directly to form the DHCBR 126 and the conducting channel 131. The adjoining layers to the middle layer 190 may also both be high index mirror layers, or middle layer 190 may have a similar index to the bottom layer 170.

The vertical-cavity light sources disclosed herein are capable of very low self-heating because they can operate with high efficiency and low thermal resistance. Low thermal resistance is enabled in the lasers for example by the ability to use AlAs, which can be used in the low index mirror layers of both the upper and lower mirrors. (regarding mirrors, see upper DBR 210 and lower DBR 220 in FIG. 2 described below). AlAs is highly thermally conductive relative to many other semiconductor materials. The AlAs also increases the index contrast of the of the VCSEL cavity when compared to AlGaAs. The high index contrast enables lower optical loss due to free carrier absorption for the AlAs when compared to AlGaAs as well.

The close spacing can be achieved using thin sacrificial layers that include heterojunctions. The sacrificial layers can include impurity profiles that have been grown in during a prior epitaxial growth step, implanted, or diffused. The sacrificial layers provide protection during processing, and enable low energy implants to be carried out to create thin impurity regions in the middle layers when desired, with minimal crystal damage to the semiconductor. Combining the heterojunction with the sacrificial layer enables the selective removal of the sacrificial layer. The selective removal can be performed outside the growth chamber, or within the growth chamber prior to a subsequent growth that will include the epitaxial regrown interface.

In the AlGaAs material system, GaAs, InGaAs, or InAs can be used for sacrificial layers that join a heterojunction with AlGaAs. Selective removal of the sacrificial layers can be achieved through etching prior to loading a partially grown vertical resonant cavity light source into an epitaxial growth apparatus, or through selective etching while in the growth apparatus and in an ambient of the growth chamber suitable for additional epitaxy. Thermal etching as well as chemical etching may be used with the heterojunction approach. Similar approaches are possible for AlGaN alloys for which GaN, InGaN, or InN may be desirable for sacrificial layers. InP as well as other choices may be used for InAlGaP materials. InAs may be used for InAlGaAs materials, for example lattice matched to InP.

The conducting channel 131 in FIG. 1A that extends into a cavity spacer can also limit the effects of charge spreading in the cavity spacer that otherwise may increase laser threshold and decrease efficiency. In some embodiments the conducting channel 131 can be extended even into the active region of the device. As noted above used herein a "cavity spacer" (see upper and lower cavity spacer layers 250 and 251 in FIG. 2 described below) is defined to be a cavity region that includes the active region where the field undergoes phase change to create the resonance condition of the vertical cavity. Typically the cavity spacer layer thickness will be approximately an integer number of half-wavelengths thickness. The cavity spacer generally may have an upper cavity spacer region or lower cavity spacer region. For example, in a full wave cavity spacer the first mirror layer may be an AlGaAs layer that has an Al composition that is increased over the material of the cavity spacer. If the active region is placed near the center of the full-wave cavity spacer it will have an upper cavity spacer region and a lower cavity spacer region. In a half-wave cavity, in contrast, the first mirror layer may be an AlGaAs composition that is lower in Al content and higher in refractive index than the cavity spacer. It is also possible that an active region is placed at the upper or lower edge of a cavity spacer, if properly designed to be close to a field intensity peak formed by the cavity spacer. In addition, the vertical-cavity light source may include more than one cavity spacer.

If the conducting channel 131 is p-type, it can include acceptor doping in the range from about $10^{17}$ cm$^{-3}$ to about $1 \times 10^{20}$ cm$^{-3}$. If the outer current blocking layer is a DHCBR such as DHCBR 126 formed by implanted depleting impurities such as silicon or oxygen, implant doses may range from less than $\sim 1 \times 10^{12}$ cm$^{-2}$ to more than $2 \times 10^{14}$ cm$^{-2}$. The implant energy can be several keV or less, and maintain low defect concentration in the middle layer 190. Regarding the layer thickness of the middle layer 190, the middle layer 190 can be as thin as only a few hundred angstroms in thickness. The high material quality combined with the minimal thickness can reduce electrical resistance in the device, since the conducting channel 131 can be kept thin as well. The high material quality enables the middle layer to be placed very close to the active region of a vertical cavity light source or other device.

In the above and embodiments described below, the regrowth interface may be placed at a position other than the depleted heterojunction interface. For example, in FIG. 1A the first epitaxial growth may include some or all of the top layer 110, or the regrown interface may exist within the middle layer 190. The depleted heterojunction 126A can still be formed in these cases. In addition, the depleting impurity region 180 may be placed away from the interface as described above, as long as it is sufficiently close to cause depletion of heterojunction 126A and form the DHCBR 126.

FIGS. 2 through 6 are schematic illustrations of the heterostructure blocking region, middle layer, and conducting channel used in disclosed vertical cavity light sources. In some process flows the substrate (for example substrate 205 in FIG. 2) is removed at or near the end of processing, so that the light source 200 may include the epitaxial layers or a portion of the epitaxial layers shown. In this case the light source 200 shown in FIG. 2 would also include any protecting dielectric layers and electrodes that form the light source, but with no supporting substrate or only a thin partial substrate. In this process flow the light source is generally transferred to another substrate or mount. For example, a substrate-less light source may be transferred to a silicon substrate for integration with silicon-based electronics, so that the epi film of the laser can be grown on its matching substrate (e.g., GaAs), since it may not be able to be grown on a silicon substrate due to epitaxial incompatibility. It may also be inserted into a display.

Figure 2:
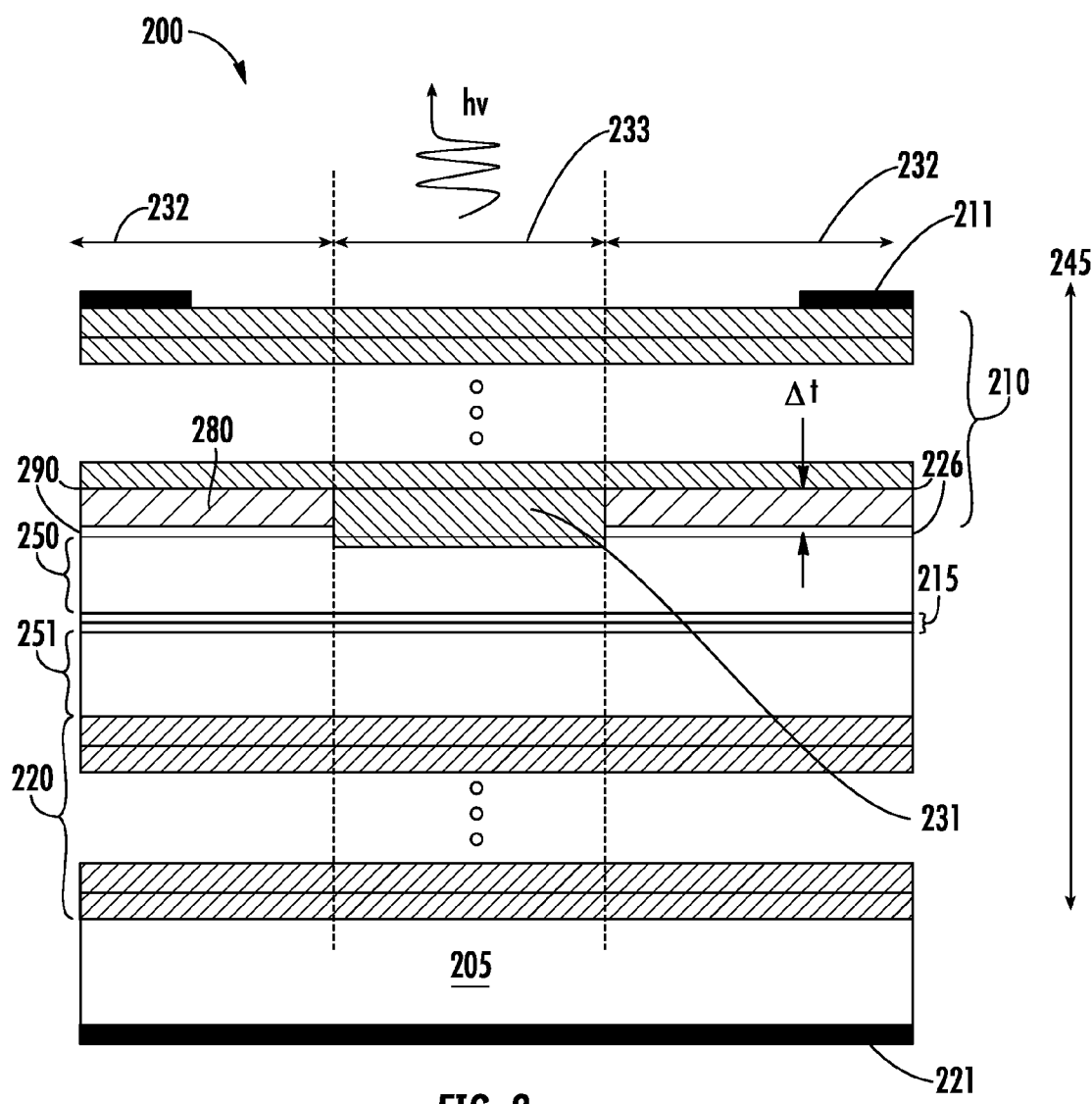
FIG. 2 is a schematic cross sectional diagram of a semiconductor vertical cavity diode light source that includes a conducting channel framed by a current blocking layer provided by a DHCBR that provides electrical confinement. The DHCBR includes at least one depleting impurity species.

FIG. 2 shows an example light source 200 that includes a DHCBR 226 with a depleting impurity region 280. The DHCBR 226 is shown as being the same layer as the middle layer 290 which can be a DBR layer. Light source 200 includes a substrate 205 on which is epitaxially grown a stack of layers including a lower DBR 220 of alternating low and high index DBR mirror layers, a lower cavity spacer layer 251, an active region 215, an upper cavity spacer layer 250, an upper DBR 210 of alternating low and high index DBR mirror layers, and an electrode 221 is formed on the substrate as well as an electrode 211 on the top of DBR 210. The lower DBR 220, cavity spacer layer 251, active region 215, upper cavity spacer layer and upper DBR 210 along with any additional protective layers create the vertical cavity 245. The light source 200 includes inner mode confinement region 233 and outer current blocking region 232.

Light source 200 uses the depleting impurity region 280 created in the middle layer 290 that is also a low index quarter wave mirror layer of upper DBR 210. The depleting impurity region 280 and heterojunctions of the middle layer 290 creates the DHCBR 226 by depleting part or all of middle layer 290 of most of its charge carriers. For example if the DBR layer 290 is mainly carbon doped AlGaAs as grown, a donor impurity region 280 can be formed by implantation or diffusion to deplete or partially deplete the middle layer 290. The donor impurity region 280 can be formed using an intermediate fabrication step that occurs between two epitaxial growth steps. A portion of the middle layer 290 can then form the DHCBR 226.

The conducting channel 231 can be created for example by the remaining carbon doped middle layer 290 within mode confining region 233. The carbon doping in middle layer 290 then provides hole conductivity for conducting channel 231. In order to increase current blocking and prevent electron transport from lower DBR 220 which in general is n-type conductivity, the heterojunction of the middle layer 290 along with intermediate layers between middle layer 290 and the n-conducting region of 220 should be sufficient to also block electron flow from the lower n-type DBR. Because heterojunctions typically have different conduction and valence band offsets, the heterojunctions of the DHCBR 226 or surrounding regions can then be chosen to block hole flow in the current blocking region 232 from the upper DBR 210 into the DHCBR 226, and different heterojunctions used to block electron flow from the lower DBR 220. For example, AlAs forms a large valence band offset with low Al composition AlGaAs, but a relatively smaller electron band offset. In contrast AlGAs with Al content in the range of 35% to 50% can form a relatively large conduction band offset with relatively smaller valence band offset. Therefore the upper cavity spacer layer 250 may be chosen along with active region 215 to block electron flow in the outer current blocking region 232 based on the conduction band offsets.

FIG. 2 shows the conducting channel 231 formed in the middle layer 290 extending to and electrically contacting the upper cavity spacer layer 250. The conducting channel 231 may also use a selective impurity region that extends the conducting channel 231 into the cavity spacer and/or active region to further reduce electrical resistance into the active region 215. A portion of the upper cavity spacer layer 250 may also be doped p-type to assist in blocking electron flow in the outer current blocking region 232. The lower cavity spacer doped layer 251 may also be doped n-type to reduce electrical resistance. The conducting channel 231 may also be created in the upper cavity spacer layer 250 using a grown in acceptor, and depleting impurity region 280 may be created using a shallow donor impurity such as silicon or other donor impurity.

The depleting impurity may also be an impurity such as oxygen that remains stable in the lattice under the subsequent relatively high epitaxial growth step. Note the depleting impurity region 280 can make the carrier density due to the DHCBR 226 such that its conductivity is also sufficiently low to form the current block. In order to restrict hole flow within the upper cavity spacer layer 250, additional donor or other impurity implant may be performed to extend a depletion region within the upper cavity spacer layer 250 in the outer current blocking region 232, decreasing capacitance. It is an advantage if conducting channels are able to reduce mobile charge current spreading that would otherwise occur if cavity spacer layer 250 is uniformly doped in the inner mode confinement region 233 and in the outer current blocking region 232.

Figure 3:
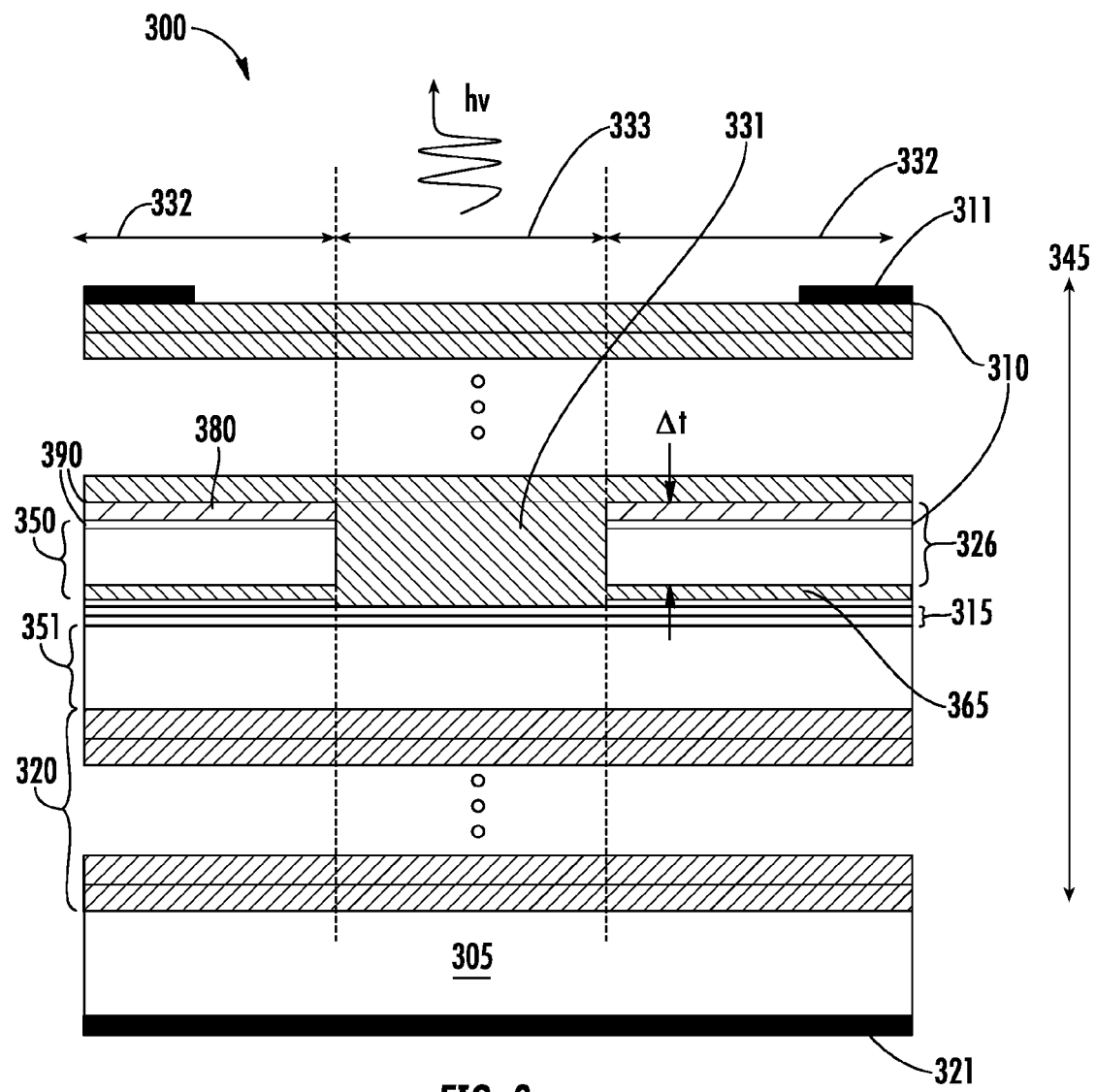
FIG. 3 is a schematic cross sectional diagram of a semiconductor vertical cavity diode light source that includes a conducting channel formed by an impurity region that is framed by a DHCBR that includes at least one depleting impurity. A second impurity region is created beneath the DHCBR that serves to increase the current blocking outside the conducting channel.

FIG. 3 shows another embodiment for a vertical cavity light source 300 in which a DHCBR 326 containing a depleting impurity region 380 in the middle layer 390 is combined with an optional second impurity region 365 formed in an upper cavity spacer layer 350 to create the current blocking region. The upper cavity spacer layer 350 adjoins the middle layer 390 which can be a DBR layer. The conducting channel 331 is formed in the middle layer 390 and upper cavity spacer layer 350. The middle layer 390 is thus a low index layer of an upper DBR 310. Upper DBR layer 310 fully includes the middle layer 390 which as described above can be a lower DBR layer.

This combination can achieve both low electrical capacitance and low electrical resistance into the active region 315 of the vertical cavity light source. The second impurity region 365 in this case is used to block electron flow from the lower DBR 320 and increase current blocking in the outer current blocking region 332. In this case the light source 300 is formed using substrate 305 on which lower DBR 320 is formed using a stack of epitaxial layers of alternating high and low index DBR layers, along with lower cavity spacer layer 351, active region 315, upper cavity spacer layer 350, and upper DBR 310. Upper DBR 310 is also made of alternating high and low index DBR layers. Lower DBR 320, cavity spacer layer 351, active region 315, upper cavity spacer layer 350, and upper DBR 310, along with any additional dielectric or protective layers to form a laser cavity 345. The light source 300 includes outer current blocking region 332 and inner mode confinement region 333.

The outer current blocking region 332 includes the DHCBR 326 with depleting impurity region 380, and second impurity region 365. The second impurity region 365 can be created with a grown in shallow acceptor impurity. Shallow impurities such as Be, Zn, or Cd may be used, while C may have an advantage because of its relatively slow diffusion during subsequent processing. While DHCBR 326 can serve to block hole flow in the current blocking region 332, optional second impurity region 365 serves to block electron flow from the lower DBR 320.

DHCBR 326 may be created by implanting or diffusing to form the depleting impurity region 380 into the middle layer 390, and possibly including part of cavity spacer layer 350. By choosing a grown in acceptor profile in the cavity spacer layer 350 and middle layer 390, the conducting channel 331 can be created including in the cavity spacer layer 350, 351. An acceptor impurity such as Be or some other shallow acceptor (Zn, Cd, Mg, or some other) may also be selectively formed in the conducting channel 331 to make the conducting channel p-type. The selective acceptor placement in the conducting channel 331 can be achieved using either implantation or diffusion, or a combination of these two as described above.

In both FIG. 2 and FIG. 3 the respective depleting impurity regions 280 and 380 may be formed by complexing two (or more) different impurity species. For example a Column II acceptor specie may be complexed with a Column VI specie oxygen. In this case the acceptor impurity may be used to also reduce the electrical resistance of the conducting channel 231 or 331, where the complexing specie such as oxygen is prevented from incorporation in the inner mode confinement regions 233 or 333.

Figure 4:
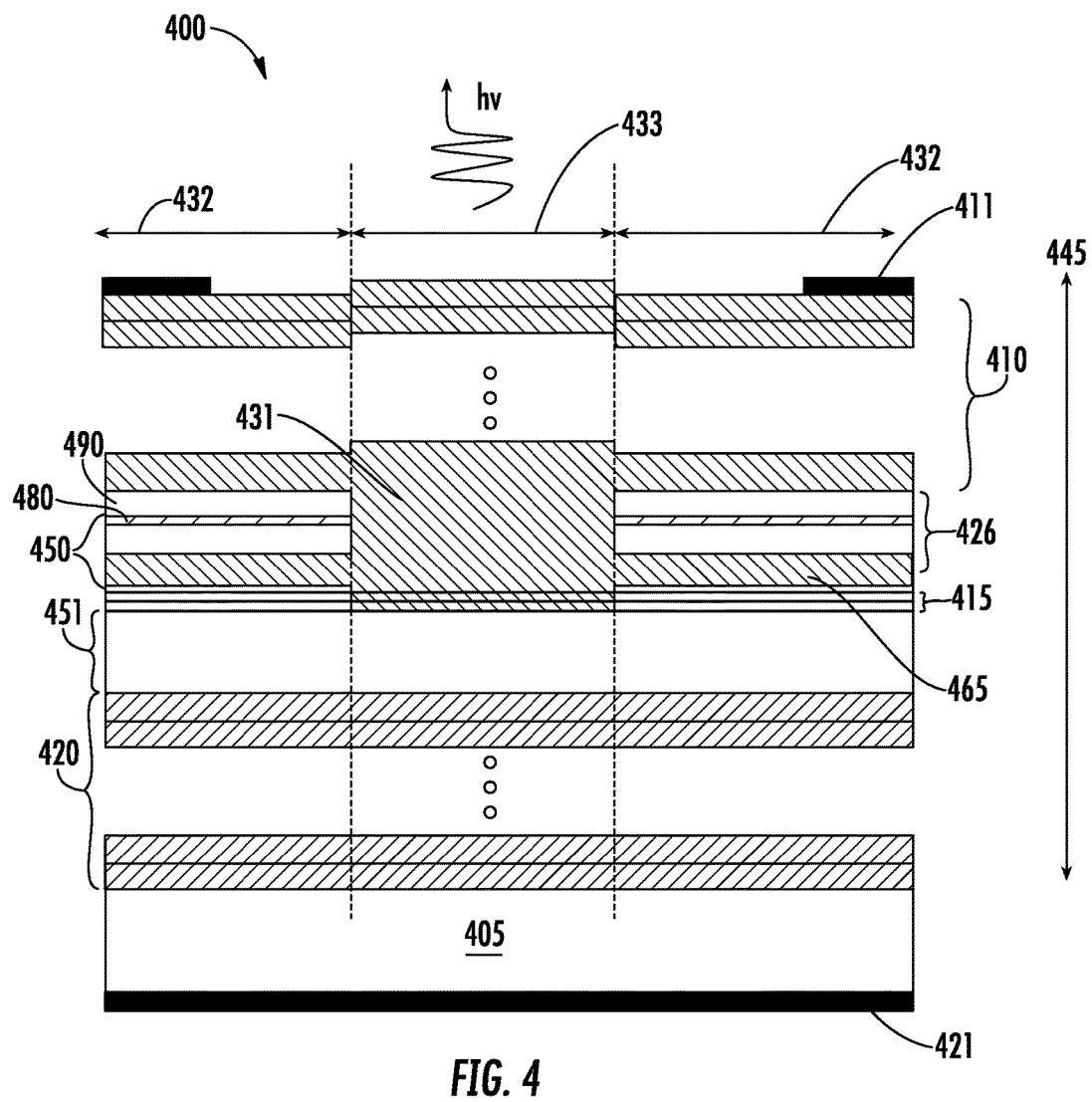
FIG. 4 is a schematic cross sectional diagram of a semiconductor vertical cavity diode light source that includes a conducting channel framed by a DHCBR that includes at least one depleting impurity. The vertical cavity light source includes a shallow impurity region within the cavity spacer that increases current blocking of the DHCBR.

FIG. 4 shows a light source 400 that includes a lower substrate 405, a lower DBR 420, a lower cavity spacer layer 451, an active region 415, an upper cavity spacer region 450, and an upper DBR 410. The middle layer 490 can comprise a DBR layer. As with the light sources described above, for light source 400 the conducting channel 431 is shown extending into a cavity spacer shown as a cavity spacer 450. Lower DBR 420, lower cavity spacer 451, active region 415, upper cavity spacer layer 450, and upper DBR 410, along with any dielectric or protective layers not shown, form the laser cavity 445. Electrode 421 is used on the substrate 405, and electrode 411 is used on the upper DBR 410.

Light source 400 includes an outer current blocking region 432 and inner mode confinement region 433. The conducting channel 431 is used to achieve low electrical resistance for injection of holes into active region 415. The depleting impurity region 480 is used to create a DHCBR 426, and in this case the depleting impurity region 480 is formed just beneath the middle layer 490 in the cavity spacer layer 450. The mode confinement region 433 of light source 400 can include a mesa as shown to increase its mode confining ability. This inclusion of a mesa is generally possible in each of the embodiments disclosed herein through selective etching performed in intermediate fabrication steps of the light source 400 between two epitaxial growth steps.

Depleting impurity region 480 may be created for example using an impurity implant of a shallow donor such as silicon, or other shallow donor, or oxygen, or other stable impurity implanted so that its peak concentration exists just below the middle layer 490 in cavity spacer layer 450. Conducting channel 431 can then be comprised of grown-in acceptor impurities, with a second impurity region 465 used to confine the mobile hole charge mainly to the inner mode confinement region 433. Second impurity region 465 may also be grown in and include shallow acceptors for high material quality, and include most or all of the cavity spacer layer 450, or some portion therein.

Alternatively, the depleting impurity region 480 may be grown in to include the shallow donor impurity region within the cavity spacer layer 450, including the current blocking region 432 and in the inner mode confinement region 433. In the case that the depleting impurity region 480 is grown in, the conducting channel 431 can be created by counter doping the depleting impurity region 480 using an acceptor implantation and/or diffusion to create the conducting channel. The depleting impurity region 480 exists in the outer current blocking region 432 which increases the current blocking of the DHCBR 426. As with the embodiments described above, the conducting channel 431 can extend into the active region 415 improving injection of holes into the active region. Although not shown, lower cavity spacer layer 451 may also be doped n-type to further reduce electrical resistance of the light source 400.

Figure 5:
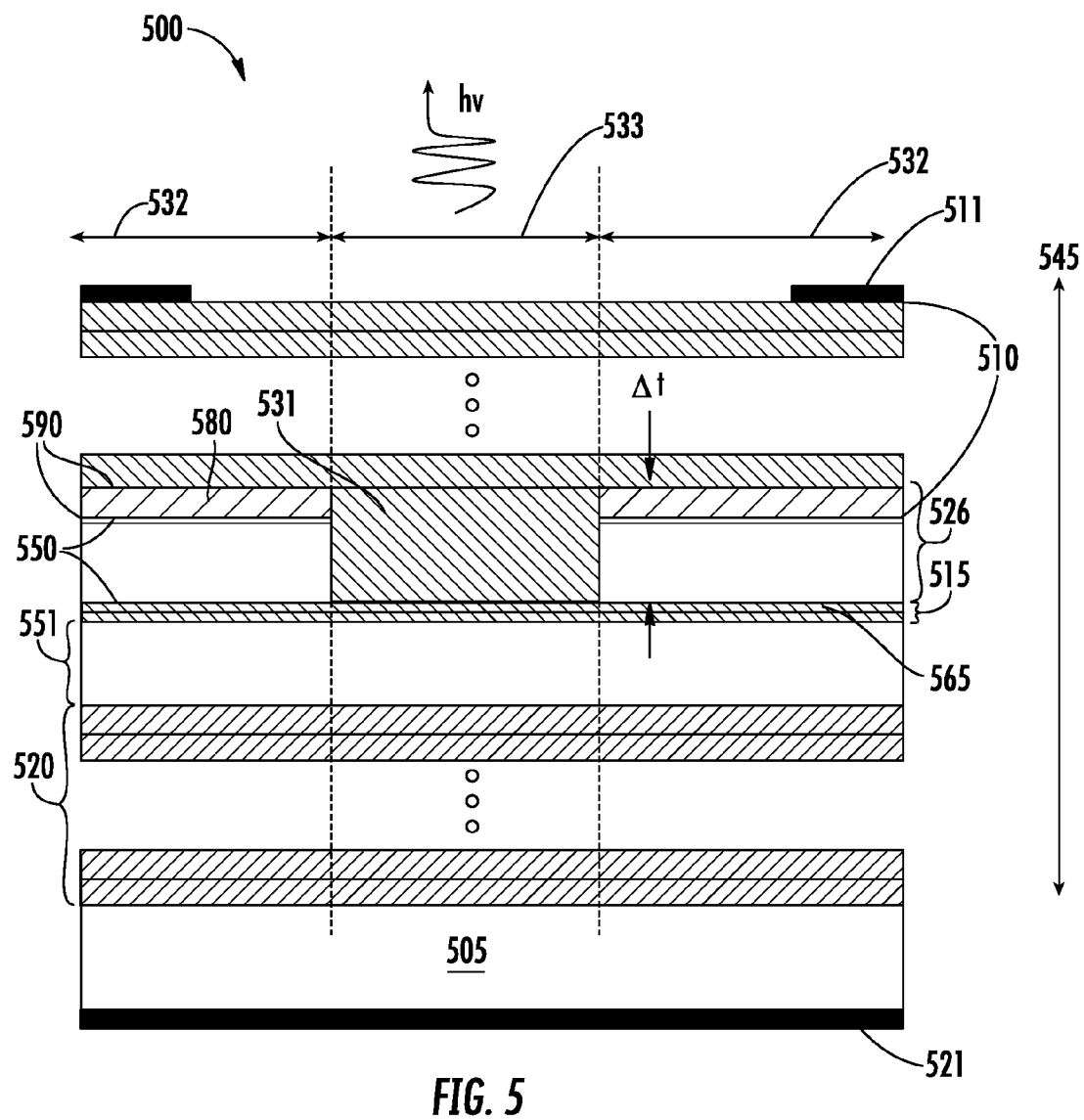
FIG. 5 is a schematic cross sectional diagram of a semiconductor vertical cavity diode light source that includes a conducting channel framed by a DHCBR that includes at least one depleting impurity, for which the active region or layers surrounding the active region include shallow dopant impurities that increase the current blocking of the DHCBR and can increase the gain and differential gain of the vertical cavity light source.

FIG. 5 shows a light source 500 that includes substrate 505, lower DBR 520, lower cavity spacer layer 551, active region 515, upper cavity spacer layer 550, upper DBR 510, and electrodes 521 and 511. Light source 500 includes an inner more confinement region 533 and outer current blocking region 532. The DHCBR 526 includes a middle layer 590 that can be a low index DBR layer with the depletion extending into the cavity spacer layer 550. Active region 515 includes accepter dopants in the second impurity region 565. The upper DBR 510 includes the middle layer 590 which as noted above can be a DBR layer. The acceptor dopant impurities in the second impurity region 565 may be placed in the active material of active region 515, or in barrier layers to the quantum well, quantum dot, bulk, or quantum wire active region 515. For example impurity region 565 can be introduced as modulation doping in which the acceptor impurity reside in thin barrier layers close to the active region 515, and the mobile equilibrium hole charge due to these acceptors reside mainly in the active layers (i.e. quantum wells, quantum dots, bulk, or quantum wires) of the active region 515. The conducting channel 531 extends into the cavity spacer close to or extending into the active region 515. Light source 500 provides the benefit of low capacitance, low electrical resistance, and high differential efficiency from the active region 515. The high differential efficiency of the active region is created by the equilibrium hole charge residing in the active layer 515. Therefore light source 500 is capable of very high modulation speed.

The depleted heterojunction is fabricated in the middle layer 590 being a low index DBR layer by introducing the depleting impurity region 580 into this layer. The conducting channel 531 of light source 500 can be fabricated using a diffused or implanted acceptor impurity that extends into the cavity spacer layer 550. Although FIG. 5 shows the conducting channel 531 extending into the active region, the conducting channel may also be limited to the middle layer 590 or extend only partially into the cavity spacer layer 550. Alternatively, the conducting channel 531 may be formed using a grown-in acceptor impurity, and a sufficient dose and extent of the depleting impurity may extend the depleting impurity into the cavity spacer to deplete the cavity spacer layer 550. The depleting impurity may be a shallow donor, oxygen, a stable complex such as between a Column II impurity and oxygen, or another stable depleting impurity specie that allows the high temperature processing needed for epitaxial regrowth.

Note that the light source 500, and the other light sources are shown using relatively high index cavity spacer layers (layers 550 and 551 in FIG. 5) and a low index DBR layer 590. Instead, these light sources may be realized using low index half-wave cavity spacers with the depleted heterojunction formed directly in the upper cavity spacer between the cavity spacer and a high index DBR layer adjoining the cavity spacer.

Figure 6:
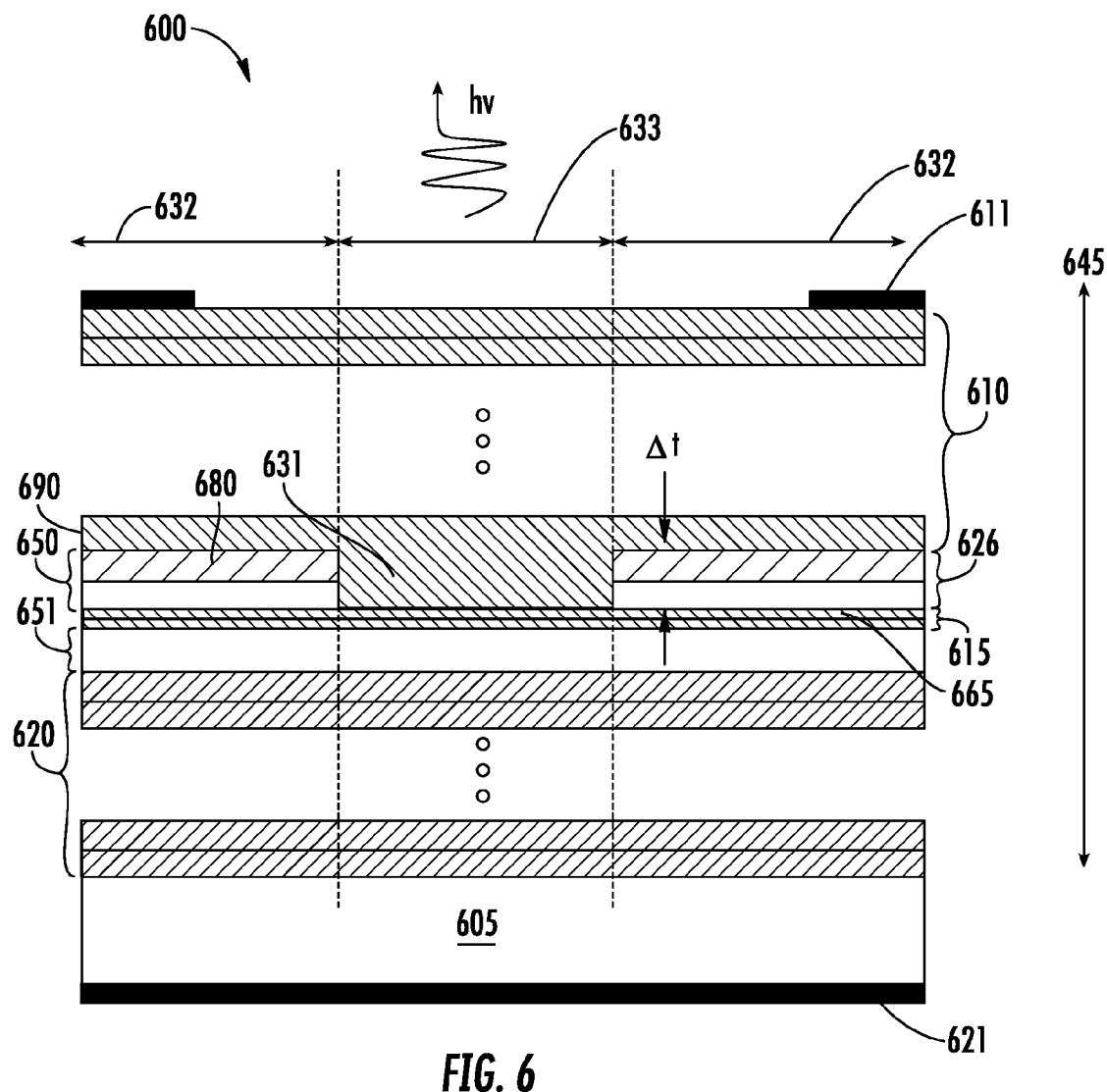
FIG. 6 is a schematic cross sectional diagram of a semiconductor vertical cavity diode light source that includes the DHCBR in a half-wave optical cavity spacer.

FIG. 6 shows a half-wave cavity embodiment in light source 600. Light source 600 includes substrate 605, lower DBR 620, lower cavity spacer layer 651, active region 615, upper cavity spacer layer 650, upper DBR 610 including the middle layer 690, and electrodes 621 and 611. The light source 600 includes an inner mode confinement region 633 and outer current blocking region 632. The outer current blocking region includes the DHCBR 626 and conducting channel 631. The active region 615 includes the second impurity region 665 that builds in acceptors and creates an equilibrium excess hole charge in the active region similar to the active region of light source 500.

Light source 600 uses low index cavity spacer layers 651 and 650 and a half-wave cavity spacer. The upper cavity spacer layer 650 is the middle layer comprising the DHCBR 626 and the conducting channel 631. The depleted heterojunction is formed directly between the relatively low index cavity spacer layer 650 and relatively high index middle layer 690 of the upper DBR 610. The conducting channel 631 can be formed in the middle layer from either implantation or diffusion of an acceptor impurity, or from a grown-in acceptor impurity. The depleting impurity region 680 is shown at the upper edge of cavity spacer layer 650. Again this depleting impurity region 680 may be implanted, diffused, grown-in, or a complex between one or more impurity species that form a complex. Light source 600 has the advantage of a shorter overall cavity length 645, and this can increase the light source speed. In addition, fabrication requirements can be decreased because of the shorter distances needed for introducing impurities.

Variations of cavity lengths are obviously possible in all disclosed light sources that may be used to decrease capacitance, control electrical resistance, or control light emission and the optical mode due to different cavity spacers.

While various disclosed embodiments have been described above, it should be understood that they have been presented by way of example only, and not limitation. Numerous changes to the subject matter disclosed herein can be made in accordance with this Disclosure without departing from the spirit or scope of this Disclosure. In addition, while a particular feature may have been disclosed with respect to only one of several implementations, such feature may be combined with one or more other features of the other implementations as may be desired and advantageous for any given or particular application.

Thus, the breadth and scope of the subject matter provided in this Disclosure should not be limited by any of the above explicitly described embodiments. Rather, the scope of this Disclosure should be defined in accordance with the following claims and their equivalents.

Unless otherwise defined, all terms (including technical and scientific terms) used herein have the same meaning as commonly understood by one of ordinary skill in the art to which embodiments of the invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The invention claimed is:

1. A semiconductor heterostructure device, comprising:
a middle layer including an inner conducting channel and an outer current blocking region, wherein said middle layer comprises an epitaxially regrown interface;
a depleted heterojunction current blocking region (DH-CBR) within said outer current blocking region,
wherein said DHCBR includes a depleting impurity region comprising at least one depleting impurity which increases a depletion of said DHCBR so that said DHCBR forces current to flow into said conducting channel during electrical biasing under normal operation of said semiconductor heterostructure device, and
wherein said depleting impurity has a maximum concentration that is within 700 Å of said epitaxially regrown interface.

2. The semiconductor heterostructure device of claim 1, wherein said depleting impurity region comprises silicon or oxygen.

3. The semiconductor heterostructure device of claim 1, wherein said middle layer comprises AlAs.

4. The semiconductor heterostructure device of claim 1, wherein said middle layer comprises a mesa.

5. The semiconductor heterostructure device of claim 1, wherein said DHCBR includes a first depleting impurity specie and a second depleting impurity specie.

6. The semiconductor heterostructure device of claim 5, wherein said first depleting impurity specie is beryllium and said second depleting impurity specie is oxygen.

7. A semiconductor vertical resonant cavity light source, comprising:
an upper mirror comprising alternating low refractive index mirror layers and high refractive index mirror layers and a lower mirror comprising alternating low refractive index mirror layers and high refractive index mirror layers;
at least one active region for light generation between said upper mirror and said lower mirror;
at least one cavity spacer layer between at least one of said upper mirror and said lower mirror and said active region;
said light source including an inner mode confinement region and an outer current blocking region;
a depleted heterojunction current blocking region (DH-CBR) including a depleting impurity region comprising at least one depleting impurity region within said outer current blocking region of at least one of said upper mirror, said lower mirror, and said active region, and
a middle layer including a conducting channel within said inner mode confinement region that is framed by said DHCBR, wherein said middle layer comprises an epitaxially regrown interface, wherein said depleting impurity has a maximum concentration that is within 700 Å of said epitaxially regrown interface, and wherein said DHCBR forces current flow into said conducting channel during normal operation of said light source.

8. The light source of claim 7, wherein said middle layer comprises a low refractive index mirror layer to either said upper mirror or said lower mirror.

9. The light source of claim 7, wherein said middle layer comprises said cavity spacer layer between at least one of said upper mirror and said lower mirror and said active region.

10. The light source of claim 7, wherein said middle layer comprises AlAs.

11. The light source of claim 7, wherein said cavity spacer layer includes a second impurity region.

12. The light source of claim 7, wherein said active region includes a second impurity region.

13. The light source of claim 7, wherein said depleting impurity region includes silicon or oxygen.

14. The light source of claim 7, further comprising at least one upper cavity spacer layer placed between said DHCBR and said active region, wherein said conducting channel extends into said cavity spacer layer.

15. The light source of claim 7, wherein said middle layer comprises a mesa.

16. The light source of claim 7, wherein said depleting impurity region includes first depleting impurity specie and a second depleting impurity specie.

17. The light source of claim 16, wherein said first depleting impurity comprises a Column II acceptor, wherein said second depleting impurity comprises oxygen.

18. The light source of claim 17, wherein said first depleting impurity comprises beryllium.

19. A semiconductor vertical resonant cavity light source, comprising:

an upper mirror comprising alternating low refractive index mirror layers and high refractive index mirror layers and a lower mirror comprising alternating low refractive index mirror layers and high refractive index mirror layers;

at least one active region for light generation between said upper mirror and said lower mirror;

at least one cavity spacer layer between at least one of said upper mirror and said lower mirror and said active region;

said light source including an inner mode confinement region and an outer current blocking region;

a depleted heterojunction current blocking region (DHCBR) including a depleting impurity region comprising a first depleting impurity specie comprising a Column II acceptor and a second depleting impurity comprising oxygen within said outer current blocking region of at least one of said upper mirror, said lower mirror, and said active region, and a middle layer including a conducting channel within said inner mode confinement region that is framed by said DHCBR, wherein said DHCBR forces current flow into said conducting channel during normal operation of said light source.

* * * * *